(12) United States Patent
Lin et al.

(10) Patent No.: US 11,011,463 B2
(45) Date of Patent: May 18, 2021

(54) DIELECTRIC HELMET-BASED APPROACHES FOR BACK END OF LINE (BEOL) INTERCONNECT FABRICATION AND STRUCTURES RESULTING THEREFROM

(71) Applicant: Intel Corporation, Santa Clara, CA (US)

(72) Inventors: Kevin L. Lin, Beaverton, OR (US); Richard E. Schenker, Portland, OR (US); Jeffery D. Bielefeld, Forest Grove, OR (US); Rami Hourani, Portland, OR (US); Manish Chandhok, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/096,272

(22) PCT Filed: Jul. 1, 2016

(86) PCT No.: PCT/US2016/040788
§ 371 (c)(1),
(2) Date: Oct. 24, 2018

(87) PCT Pub. No.: WO2018/004673
PCT Pub. Date: Jan. 4, 2018

(65) Prior Publication Data
US 2019/0139887 A1    May 9, 2019

(51) Int. Cl.
*H01L 23/528*    (2006.01)
*H01L 23/522*    (2006.01)
(Continued)

(52) U.S. Cl.
CPC ...... *H01L 23/528* (2013.01); *H01L 21/76807* (2013.01); *H01L 21/76816* (2013.01);
(Continued)

(58) Field of Classification Search
CPC .................................................. H01L 23/528
See application file for complete search history.

(56) References Cited

U.S. PATENT DOCUMENTS

2003/0207523 A1    11/2003   Liu et al.
2004/0130035 A1*    7/2004   Wu ............. H01L 23/53295
                                                        257/774
(Continued)

OTHER PUBLICATIONS

International Search Report and Written Opinion for International Patent Application No. PCT/US2016/040788 dated Apr. 26, 2017, 13 pgs.
(Continued)

*Primary Examiner* — Omar F Mojaddedi
(74) *Attorney, Agent, or Firm* — Schwabe, Williamson & Wyatt, P.C.

(57) ABSTRACT

Dielectric helmet-based approaches for back end of line (BEOL) interconnect fabrication, and the resulting structures, are described. In an example, a semiconductor structure includes a substrate. A plurality of alternating first and second conductive line types is disposed along a same direction of a back end of line (BEOL) metallization layer disposed in an inter-layer dielectric (ILD) layer disposed above the substrate. A dielectric layer is disposed on an uppermost surface of the first conductive line types but not along sidewalls of the first conductive line types, and is disposed along sidewalls of the second conductive line types but not on an uppermost surface of the second conductive line types.

20 Claims, 15 Drawing Sheets

(51) Int. Cl.
  *H01L 23/498* (2006.01)
  *H01L 23/532* (2006.01)
  *H01L 23/48* (2006.01)
  *H01L 25/065* (2006.01)
  *H01L 21/768* (2006.01)

(52) U.S. Cl.
  CPC .. *H01L 21/76831* (2013.01); *H01L 21/76832* (2013.01); *H01L 21/76834* (2013.01); *H01L 21/76897* (2013.01); *H01L 23/5226* (2013.01)

(56) References Cited

U.S. PATENT DOCUMENTS

| | | | |
|---|---|---|---|
| 2011/0005070 A1 | 1/2011 | Tang | |
| 2011/0266691 A1* | 11/2011 | Lin | H01L 23/49827 257/774 |
| 2012/0032344 A1 | 2/2012 | Usami | |
| 2012/0094437 A1* | 4/2012 | Han | H01L 23/481 438/109 |
| 2012/0184080 A1 | 7/2012 | Lukaitis et al. | |
| 2013/0187287 A1* | 7/2013 | Park | H01L 21/76898 257/774 |
| 2013/0228936 A1 | 9/2013 | Han et al. | |
| 2013/0252422 A1* | 9/2013 | Chiou | H01L 23/481 438/667 |
| 2014/0103520 A1* | 4/2014 | Kirby | H01L 23/481 257/737 |
| 2015/0171011 A1 | 6/2015 | Kato | |
| 2016/0064321 A1 | 3/2016 | Huang | |
| 2016/0148869 A1* | 5/2016 | Schenker | H01L 21/0332 257/774 |

OTHER PUBLICATIONS

Search Report from European Patent Application No. 16907623.9, dated Jan. 27, 2020, 7 pgs.
International Preliminary Report on Patentablity for International Patent Applicatio No. PCT/US2016/040788, dated Jan. 10, 2019, 10 pages.
Search Report from Taiwan Patent Application No. 106117050), dated Aug. 27, 2020, 15 pgs.
Notice of Allowance from Taiwan Patent Application No. 106117050, dated Mar. 3, 2021, 3 pgs.

* cited by examiner

DIELECTRIC HELMET-BASED APPROACHES FOR BACK END OF LINE (BEOL) INTERCONNECT FABRICATION AND STRUCTURES RESULTING THEREFROM

CROSS-REFERENCE TO RELATED APPLICATION

This patent application is a U.S. National Phase Application under 35 U.S.C. § 371 of International Application No. PCT/US2016/040788, filed Jul. 1, 2016, entitled "DIELECTRIC HELMET-BASED APPROACHES FOR BACK END OF LINE (BEOL) INTERCONNECT FABRICATION AND STRUCTURES RESULTING THEREFROM," which designates the United States of America, the entire disclosure of which is hereby incorporated by reference in its entirety and for all purposes.

TECHNICAL FIELD

Embodiments of the invention are in the field of semiconductor structures and processing and, in particular, dielectric helmet-based approaches for back end of line (BEOL) interconnect fabrication, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be modeled sufficiently accurately, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners. The above factors are also relevant for considering placement and scaling of dielectric plugs or metal line ends among the metal lines of back end of line (BEOL) metal interconnect structures.

Thus, improvements are needed in the area of back end metallization manufacturing technologies for fabricating metal lines, metal vias, and dielectric plugs.

DESCRIPTION OF THE EMBODIMENTS

Figure 1A:
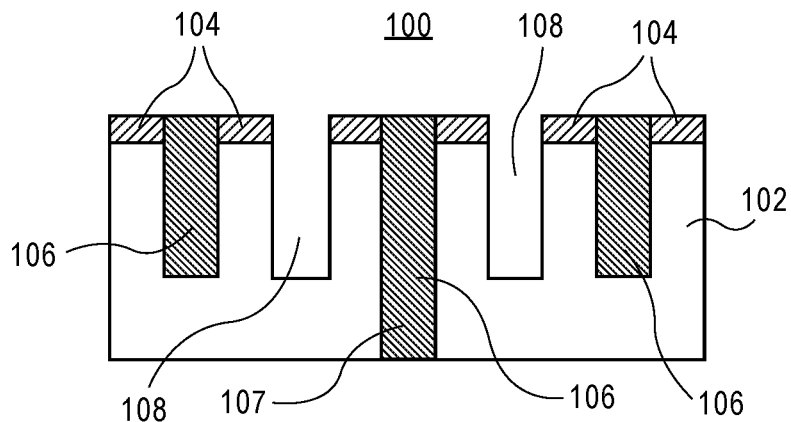
FIGS. 1A-1D illustrate cross-sectional views of portions of integrated circuit layers representing various operations in a method involving dielectric helmet formation for back end of line (BEOL) interconnect fabrication, in accordance with an embodiment of the present invention.

Dielectric helmet-based approaches for back end of line (BEOL) interconnect fabrication, and the resulting structures, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be appreciated that the various embodiments shown in the Figures are illustrative representations and are not necessarily drawn to scale.

One or more embodiments described herein are directed to methods of using a dielectric helmet for directed self-assembly (DSA) or selective growth to enable the fabrication of self-aligned interconnects. Embodiments may address or implement one or more of the use of a dielectric helmet, directed self-assembly, selective deposition, self-alignment, or patterning interconnects at tight pitch. Embodiments may be implemented to provide improved via shorting margin by self-alignment with "coloring" through selective deposition, and subsequent directed self-assembly, e.g., for the 10 nm and smaller technology nodes.

To provide context, current solutions to improve shorting margin may include: (1) using metal recess to fill alternate metal trenches with different hard masks, (2) using different "color" metal caps to as a template for directed self-assembly (DSA) or selective growth, or (3) recessing the metal or ILD to "steer" the via towards the line of interest. Overall, typical state-of-the-art process flows for improving via shorting margin require a metal recess. However, recessing metal with acceptable uniformity has proven to be a challenge in many such processing schemes. In accordance with an embodiment of the present invention, one or more of the above issues is addressed by implementing a method of depositing a non-conformal dielectric cap on half of a population of interconnects. The non-conformal dielectric cap is used as a template for selective growth or directed self-assembly. In one such embodiment, such an approach may be applied to any interconnect metal layer and, possibly, to gate contacts. In a specific embodiment, a need for metal recess as is seen in state-of-the art approaches is effectively eliminated from the processing schemes described herein.

More generally, one or more embodiments are directed to an approach for fabricating metal lines as well as the conductive vias and non-conductive spaces or interruptions between metals lines (referred to as "plugs"). Vias, by definition, are used to land on a previous layer metal pattern. In this vein, embodiments described herein enable a more robust interconnect fabrication scheme since constraints on lithography equipment is relaxed. Such an interconnect fabrication scheme can be used to save numerous alignment/exposures, and can be used to reduce total process operations and processing time otherwise required for patterning such features using conventional approaches. Other benefits may include improvements in yield, or the prevention of shorting to a wrong line.

As a general overview of concepts involved herein, FIGS. 1A-1D illustrate cross-sectional views of portions of integrated circuit layers representing various operations in a method involving dielectric helmet formation for back end of line (BEOL) interconnect fabrication, in accordance with an embodiment of the present invention.

Referring to FIG. 1A, a starting point structure 100 is provided as a beginning point for fabricating a new metallization layer. The starting point structure 100 includes a hardmask layer 104 disposed on an inter-layer dielectric (ILD) layer 102. As described below, the ILD layer may be disposed above a substrate and, in one embodiment, is disposed over an underlying metallization layer. Openings are formed in the hardmask layer 104 which correspond to trenches formed in the ILD layer 102. Alternating one of the trenches are filled with a conductive layer to provide first metal lines 106 (and, in some cases, corresponding conductive vias 107). The remaining trenches are not filled, providing open trenches 108. In an embodiment, the starting structure 100 is fabricated by patterning a hardmask and ILD layer and then metallizing half of the population of metal trenches (e.g., alternating one of the trenches), leaving the other half of the population open. In one embodiment, the trenches in the ILD are patterned using a pitch division patterning process flow. Non-limiting examples of such pitch division schemes are described in greater detail below in association with FIGS. 6A, 6B and 7. It is to be appreciated that the following process operation described below may first involve pitch division, or may not. In either case, but particularly when pitch division is also used, embodiments may enable continued scaling of the pitch of metal layers beyond the resolution capability of state-of-the art lithography equipment.

Figure 1B:
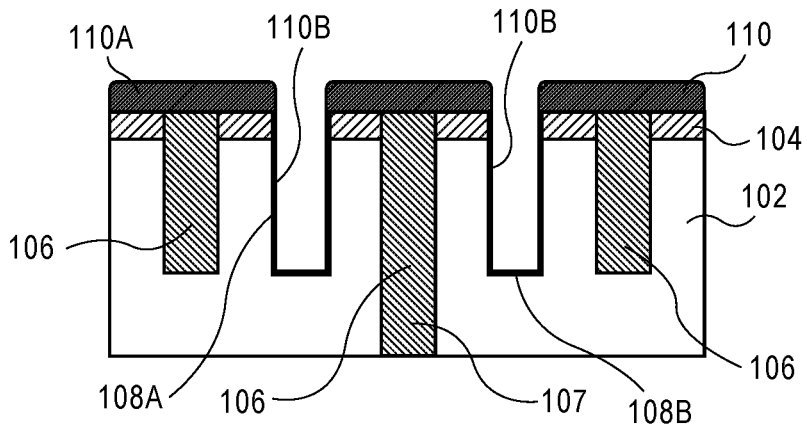

FIG. 1B illustrates the structure of FIG. 1A following deposition of a non-conformal dielectric cap layer 110 over the structure 100. The non-conformal dielectric cap layer 110 includes a first portion 100A that covers exposed surfaces of the hardmask layer 104 and the metal lines 106. The non-conformal dielectric cap layer 110 includes a second portion 110B continuous with the first portion 110A. The second portion 110B of the non-conformal dielectric cap layer 110 is formed in the open trenches 108, along sidewalls 108A and the bottom 108B of the open trenches 108. In an embodiment, the second portion 110B of the non-conformal dielectric cap layer 110 is substantially thinner than the first portion 110A, as is depicted in FIG. 1B. In other embodiments, portion 110B is nonexistent or is discontinuous. In this way, the deposition of the non-conformal dielectric cap layer 110 is considered to be a non-conformal deposition since the thickness of non-conformal dielectric cap layer 110 is not the same in all locations. The resulting geometry may be referred to as a helmet shape for the non-conformal dielectric cap layer 110 since the uppermost portions of the ILD layer 102 have the thickest portion of the non-conformal dielectric cap layer 110 thereon and, thus, are protected to a greater extent than other regions. In one embodiment, the non-conformal dielectric cap layer 110 is a dielectric material such as, but not limited to silicon nitride or silicon oxy-nitride. In one embodiment, the non-conformal dielectric cap layer 110 is formed using a plasma-enhanced chemical vapor deposition (PECVD) process or, in another embodiment physical vapor deposition (PVD).

Figure 1C:
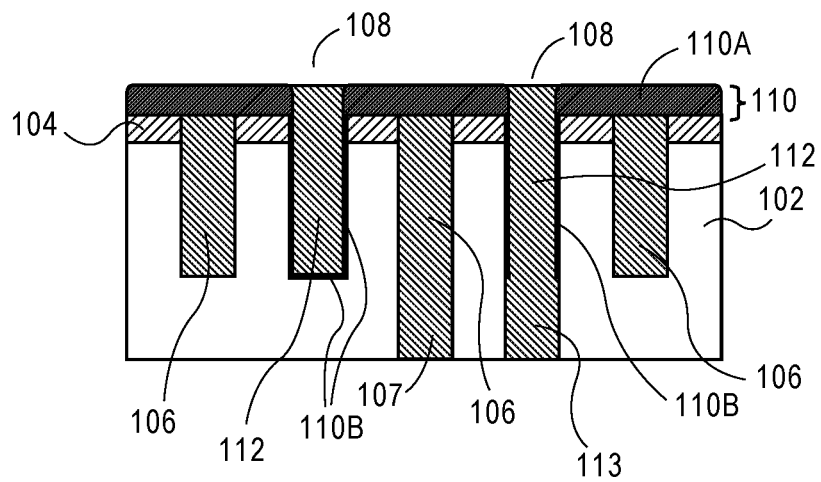

FIG. 1C illustrates the structure of FIG. 1B following via patterning, metallization, and planarization of the second half of the metal lines. In an embodiment, a metal fill process is performed to provide second metal lines 112. In one embodiment, however, prior to the metal fill, via locations are first selected and opened. Then, upon metal fill, vias 113 are formed as associated with certain ones of the second metal lines 112. In one such embodiment, via openings are formed by extending certain one of the open trenches 108 by etching through the non-conformal dielectric cap layer 110 at the bottom of the select trenches 108 and then extended the trench through the dielectric layer 102. The result is a breaking of the continuity of the non-conformal dielectric cap layer 110 at the via locations of the second metal lines 112, as is depicted in FIG. 1C.

In an embodiment, the metal fill process used to form second metal lines 112 and conductive vias 113 is performed using a metal deposition and subsequent planarization processing scheme, such as a chemical mechanical planarization (CMP) process. The planarization process exposes, but does not remove, the non-conformal dielectric cap layer 110, as is depicted in FIG. 1C. It is to be appreciated that, in an embodiment, since the second metal lines 112 (and corresponding conductive vias 113) are formed in a later process than the process used to fabricate first metal lines 106 (and corresponding conductive vias 107), the second metal lines 112 can be fabricated using a different material than is used to fabricate the first metal lines 106. In one such embodiment, a metallization layer ultimately includes conductive interconnects of alternating, differing first and second compositions. In another embodiment, however, the metal lines 112 and 106 are fabricated from substantially the same material.

In an embodiment, the first metal lines 106 are spaced apart by a pitch, and the second metal lines 112 are spaced apart by the same pitch. In other embodiments, the lines are not necessarily spaced by a pitch. However, by inclusion of the non-conformal dielectric cap layer 110, or dielectric helmet, only the surfaces of the second metal lines 112 are exposed. As a result, the pitch between neighboring first and second metal lines that would otherwise be exposed is relaxed to only the pitch of the second metal lines. Thus, alternating exposed dielectric surfaces of the non-conformal dielectric cap layer 110 and exposed surfaces of the second metal lines 112 provide a differentiated surface at the pitch of the second metal lines 112.

Figure 1D:
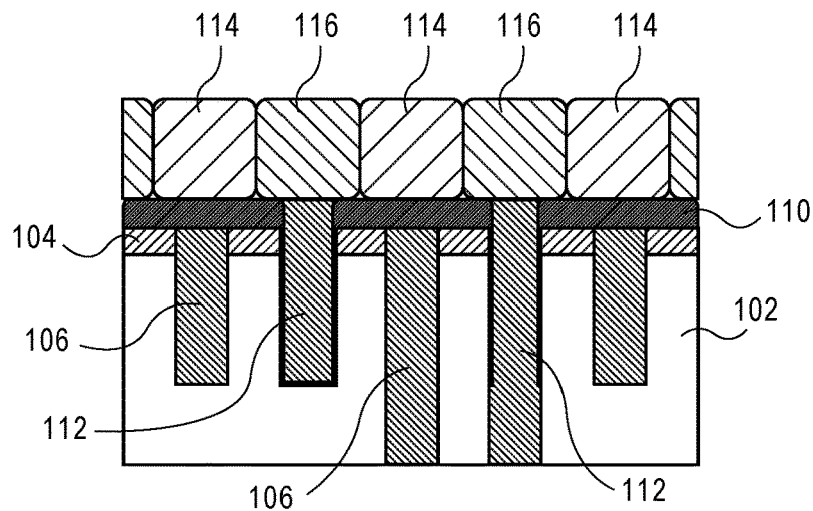

FIG. 1D illustrates the structure of FIG. 1C following a directed self-assembly or selective deposition approach to ultimately form two different, alternating, first and second hardmask layers 114 and 116, respectively. In an embodiment, the materials of the hardmask layers 114 and 116 exhibit differing etch selectivity to one another. The first hardmask layer 114 is aligned with exposed regions of the non-conformal dielectric cap layer 110. The second hardmask layer 116 is aligned with exposed regions of the second metal lines 112. As described in greater detail below, directed self-assembly or selective growth can be used to align the first and second hardmask layers 114 and 116 selectively to dielectric and metal surfaces, respectively.

In a first general embodiment, in order to ultimately form first and second hardmask layers 114 and 116, a direct self-assembly (DSA) block co-polymer deposition and polymer assembly process is performed. In an embodiment, a DSA block co-polymer is coated on the surface and annealed to segregate the polymer into first blocks and second blocks. In one embodiment, the first polymer blocks preferentially attaches to the non-conformal dielectric cap layer 110. The second polymer blocks adhere to the second metal lines 112.

In an embodiment, the block copolymer molecule is a polymeric molecule formed of a chain of covalently bonded monomers. In a di-block copolymer, there are two different types of monomers, and these different types of monomers are primarily included within two different blocks or contiguous sequences of monomers. The illustrated block copolymer molecule includes a block of first polymer and a block of second polymer. In an embodiment, the block of first polymer includes predominantly a chain of covalently linked monomer A (e.g., A-A-A-A-A . . . ), whereas the block of second polymer includes predominantly a chain of covalently linked monomer B (e.g., B-B-B-B-B . . . ). The monomers A and B may represent any of the different types of monomers used in block copolymers known in the arts. By way of example, the monomer A may represent monomers to form polystyrene, and the monomer B may represent monomers to form poly(methyl methacrylate) (PMMA), or vice versa, although the scope of the invention is not so limited. In other embodiments, there may be more than two blocks. Moreover, in other embodiments, each of the blocks may include different types of monomers (e.g., each block may itself be a copolymer). In one embodiment, the block of first polymer and the block of second polymer are covalently bonded together. The block of first polymer and the block of second polymer may be of approximately equal length, or one block may be significantly longer than the other.

Typically, the blocks of block copolymers (e.g., the block of first polymer and the block of second polymer may each have different chemical properties. As one example, one of the blocks may be relatively more hydrophobic (e.g., water repelling) and the other may be relatively more hydrophilic (water attracting). At least conceptually, one of the blocks may be relatively more similar to oil and the other block may be relatively more similar to water. Such differences in chemical properties between the different blocks of polymers, whether a hydrophilic-hydrophobic difference or otherwise, may cause the block copolymer molecules to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to "separate" from each other due to chemical dislike for the other.

However, in an embodiment, since the polymer blocks are covalently bonded to one another, they cannot completely separate on a macroscopic scale. Rather, polymer blocks of a given type may tend to segregate or conglomerate with polymer blocks of the same type of other molecules in extremely small (e.g., nano-sized) regions or phases. The particular size and shape of the regions or microphases generally depends at least in part upon the relative lengths of the polymer blocks. In an embodiment, by way of example, in two block copolymers, if the blocks are approximately the same length, a grid like pattern of alternating first polymer lines and second polymer lines is generated.

In an embodiment, the first polymer/second polymer grating is first applied as an unassembled block copolymer layer portion that includes a block copolymer material applied, e.g., by brush or other coating process. The unassembled aspect refers to scenarios where, at the time of deposition, the block copolymer has not yet substantially phase separated and/or self-assembled to form nanostructures. In this unassembled form, the block polymer molecules are relatively highly randomized, with the different polymer blocks relatively highly randomly oriented and located. The unassembled block copolymer layer portion may be applied in a variety of different ways. By way of example, the block copolymer may be dissolved in a solvent and then spin coated over the surface. Alternatively, the unassembled block copolymer may be spray coated, dip coated, immersion coated, or otherwise coated or applied over the surface. Other ways of applying block copolymers, as well as other ways known in the arts for applying similar organic coatings, may potentially be used. Then, the unassembled layer may form an assembled block copolymer layer portion, e.g., by microphase separation and/or self-assembly of the unassembled block copolymer layer portion. The microphase separation and/or self-assembly occurs through rearrangement and/or repositioning of the block copolymer molecules, and in particular to rearrangement and/or repositioning of the different polymer blocks of the block copolymer molecules.

In one such embodiment, an annealing treatment may be applied to the unassembled block copolymer in order to initiate, accelerate, increase the quality of, or otherwise promote microphase separation and/or self-assembly. In some embodiments, the annealing treatment may include a treatment that is operable to increase a temperature of the block copolymer. One example of such a treatment is baking the layer, heating the layer in an oven or under a thermal lamp, applying infrared radiation to the layer, or otherwise applying heat to or increasing the temperature of the layer. The desired temperature increase will generally be sufficient to significantly accelerate the rate of microphase separation and/or self-assembly of the block polymer without damaging the block copolymer or any other important materials or structures of the integrated circuit substrate. Commonly, the heating may range between about 50° C. to about 300° C., or between about 75° C. to about 250° C., but not exceeding thermal degradation limits of the block copolymer or integrated circuit substrate. The heating or annealing may help to provide energy to the block copolymer molecules to make them more mobile/flexible in order to increase the rate of the microphase separation and/or improve the quality of the microphase separation. Such microphase separation or rearrangement/repositioning of the block copolymer molecules may lead to self-assembly to form extremely small (e.g., nano-scale) structures. The self-assembly may occur under the influence of surface energy, molecular affinities, and other surface-related and chemical-related forces.

In any case, in some embodiments, self-assembly of block copolymers, whether based on hydrophobic-hydrophilic differences or otherwise, may be used to form extremely small periodic structures (e.g., precisely spaced nano-scale structures or lines). In some embodiments, they may be used to form nano-scale lines or other nano-scale structures that can ultimately be used to form semiconductor fin lines.

Referring again to FIG. 1D, in the case of a DSA process, in a first embodiment, the first and second hardmask layers 114 and 116 are the first and second block polymers, respectively. In a second embodiment, however, the first and second block polymers are each sequentially replaces with the materials of the first and second hardmask layers 114 and 116. In one such embodiment, selective etching and deposition process are used to replace the first and second block polymers with the materials of the first and second hardmask layers 114 and 116, respectively.

In a second general embodiment, in order to ultimately form first and second hardmask layers 114 and 116, a selective growth process is instead of a DSA approach. In one such embodiment, the material of the first hardmask layer 114 is grown above exposed portions of the underlying non-conformal dielectric cap layer 110. A second, different, material of the second hardmask layer 116 is grown above exposed portions of underlying second metal lines 112. In an embodiment, the selective growth is achieved by a dep-etch-dep-etch approach for each of the first and second materials, resulting in a plurality of layers of each of the materials. Such an approach may be favorable versus conventional selective growth techniques which can form "mushroom-top" shaped films. The mushroom topping film growth tendency can be reduced through an alternating deposition/etch/deposition (dep-etch-dep-etch) approach. In another embodiment, a film is deposited selectively over the metal followed by a different film selectively over the ILD (or vice versa) and repeated numerous times creating a sandwich-like stack. In another embodiment, both materials are grown simultaneously in a reaction chamber (e.g., by a CVD style process) that grows selectively on each exposed region of the underlying substrate.

As described in greater detail below, in an embodiment, the resulting structure of FIG. 1D enables improved via shorting margins when fabricating later via layers on the structure of FIG. 1D. In one embodiment, improved shorting margin is achieved since fabricating a structure with alternating "color" hardmasks reduces the risk of a via shorting to the wrong metal line. In one embodiment, self-alignment is achieved since the alternating color hard masks are self-aligned to the metal trenches beneath. In one embodiment, the need for a metal recess is removed from the processing scheme since which can reduce process variation.

In a first more detailed exemplary process flow, FIGS. 2A-2L illustrate cross-sectional views of portions of integrated circuit layers representing various operations in another method involving dielectric helmet formation for back end of line (BEOL) interconnect fabrication, in accordance with an embodiment of the present invention.

Figure 2A:
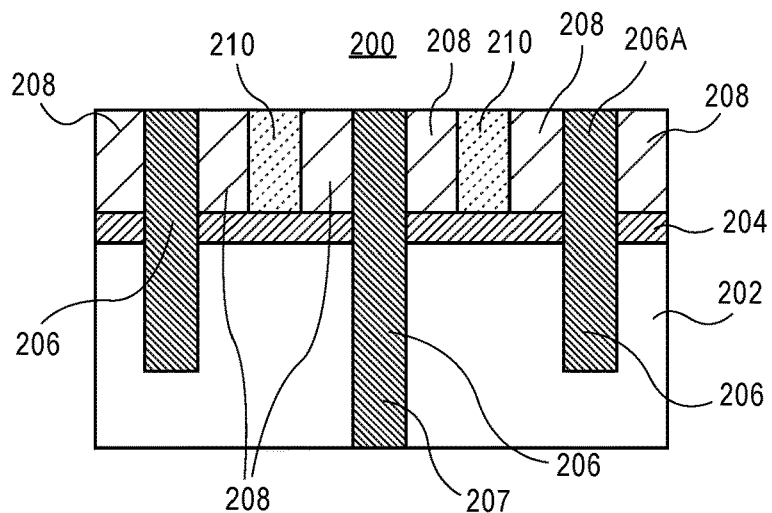
FIGS. 2A-2L illustrate cross-sectional views of portions of integrated circuit layers representing various operations in another method involving dielectric helmet formation for back end of line (BEOL) interconnect fabrication, in accordance with an embodiment of the present invention.

Referring to FIG. 2A, a starting point structure 200 is provided following first metal pass processing as a beginning point for fabricating a new metallization layer. The starting point structure 200 includes a hardmask layer 204 (e.g., silicon nitride) disposed on an inter-layer dielectric (ILD) layer 202, As described below, the ILD layer may be disposed above a substrate and, in one embodiment, is disposed over an underlying metallization layer. First metal lines 206 (and, in some cases, corresponding conductive vias 207) are formed in the ILD layer 202. Protruding portions 206A of the metal lines 206 have adjacent dielectric spacers 208. A sacrificial hardmask layer 210 (e.g., amorphous silicon) is included between neighboring dielectric spacers 208. Although not depicted, in one embodiment, the metal lines 206 are formed by first removal of a second sacrificial hardmask material between dielectric spacers 208 and then etching of the hardmask layer 204 and the ILD layer 202 to form trenches which are then filled in a metallization process.

Figure 2B:
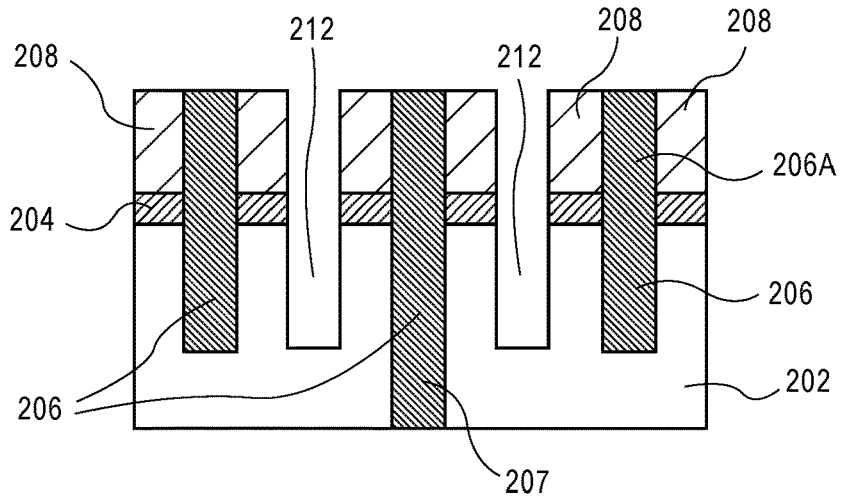

FIG. 2B illustrates the structure of FIG. 2A following second pass metal processing up to an including trench etch. Referring to FIG. 2B, sacrificial hardmask layer 210 is removed to expose hardmask layer 204. Exposed portions of the hardmask layer 204 are removed and trenches 212 are formed in the ILD layer 202.

Figure 2C:
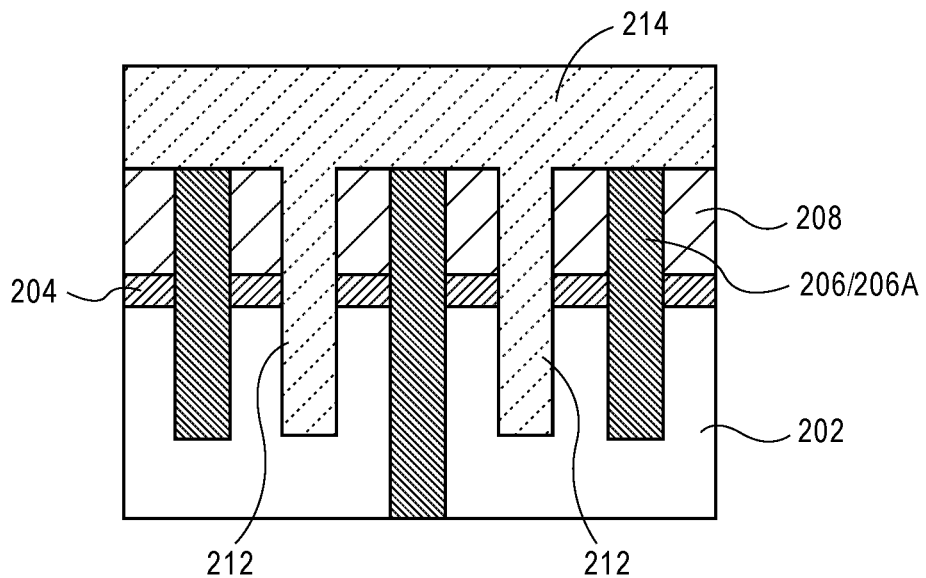

FIG. 2C illustrates the structure of FIG. 2B following sacrificial material fill. A sacrificial material 214 is formed in the trenches 212 and over the spacers 208 and metal lines 206. In an embodiment the sacrificial material 214 is formed in a spin-on process, leaving a substantially flat layer, as is depicted in FIG. 2C.

Figure 2D:
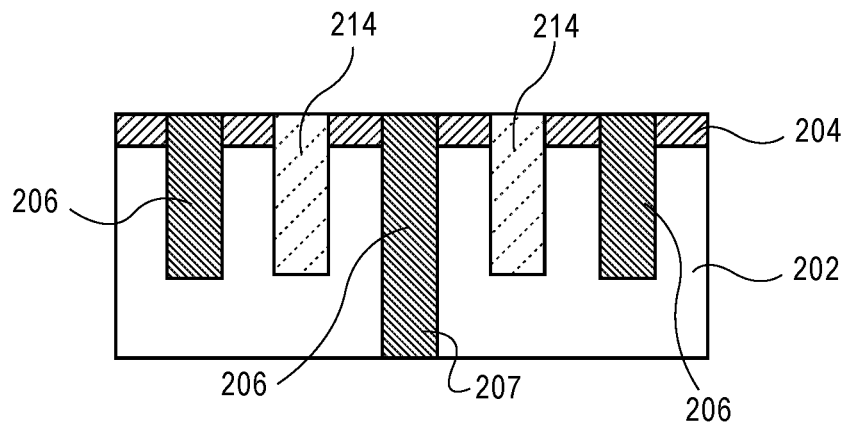

FIG. 2D illustrates the structure of FIG. 2C following a planarization process to re-expose the hardmask layer 204, to remove the dielectric spacers 208, and to remove protruding portions 206A of the metal lines 206. Additionally, the planarization process confined the sacrificial material 214 to the trenches 212 formed in dielectric layer 202. In an embodiment, the planarization process is performed using a chemical mechanical polishing (CMP) process.

Figure 2E:
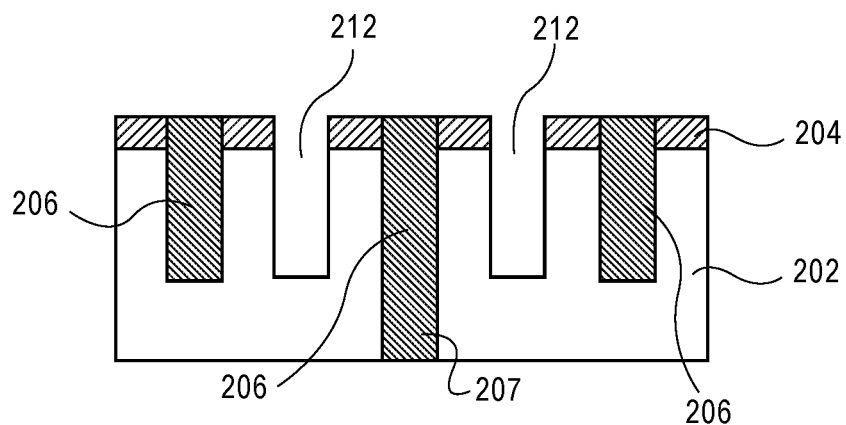

FIG. 2E illustrates the structure of FIG. 2D following sacrificial material removal. In an embodiment, the sacrificial material 214 is removed from trenches 212, using a wet etch or dry etch process.

Figure 2F:
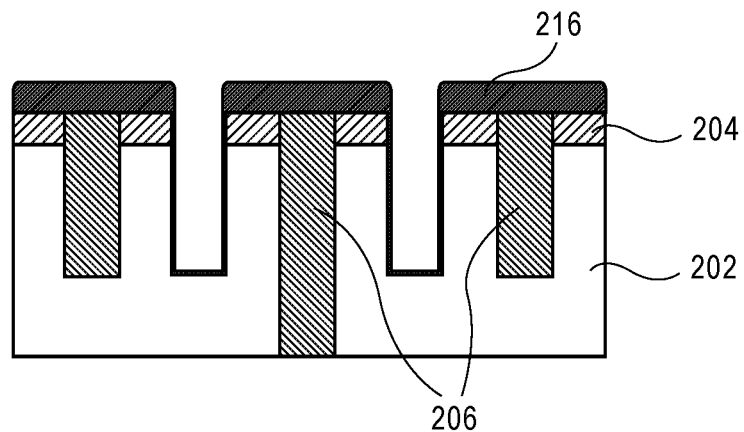

FIG. 2F illustrates the structure of FIG. 2E following deposition of a non-conformal dielectric cap layer 216, which may be referred to as a dielectric helmet. In an embodiment, the non-conformal dielectric cap layer 216 is formed using a physical vapor deposition (PVD) or chemical vapor deposition (CVD) process such as a plasma-enhanced CVD (PECVD) process. The non-conformal dielectric cap layer 216 may be as described above in association with the non-conformal dielectric cap layer 110.

Figure 2G:
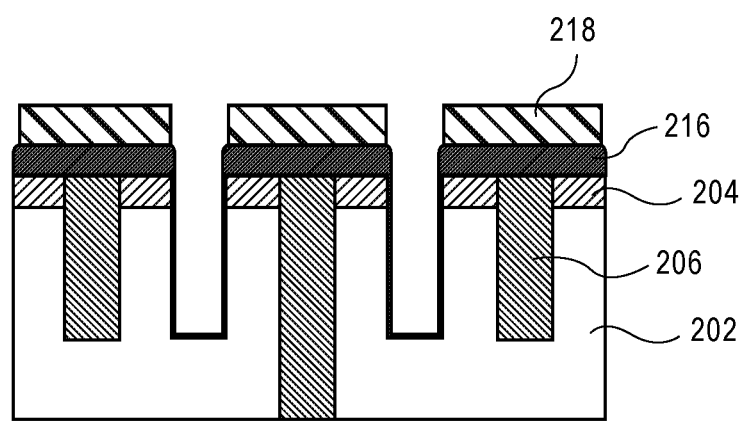

FIG. 2G illustrates the structure of FIG. 2F following deposition of a sacrificial cap layer. A sacrificial cap layer 218 is formed on upper surfaces of the non-conformal dielectric cap layer 216, and may be implemented to protect the non-conformal dielectric cap layer 216 during a subsequent etch or CMP process. In an embodiment, the sacrificial cap layer 218 is a titanium nitride (TiN) layer formed by, e.g., PVD or CVD processing.

Figure 2H:
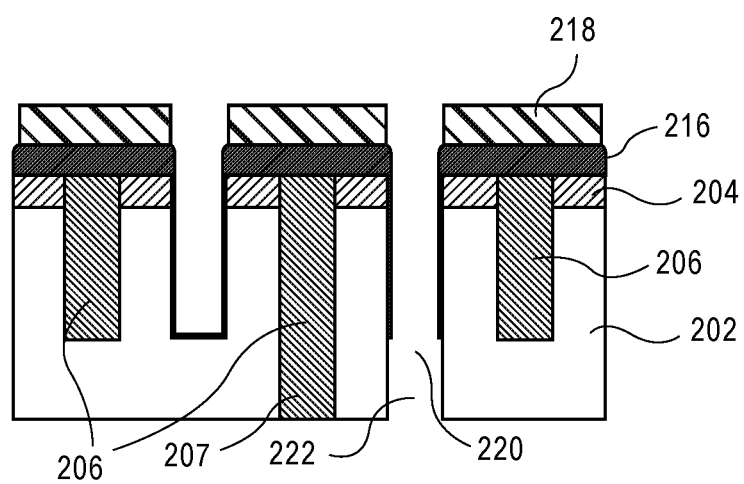

FIG. 2H illustrates the structure of FIG. 2G following via lithography and etch processing. Select ones of the trenches 208 are exposed and subject to an etch process that breaks through the non-conformal dielectric cap layer 216 at location 220 and extends the trench to provide a via location 222, as was described above.

Figure 2I:
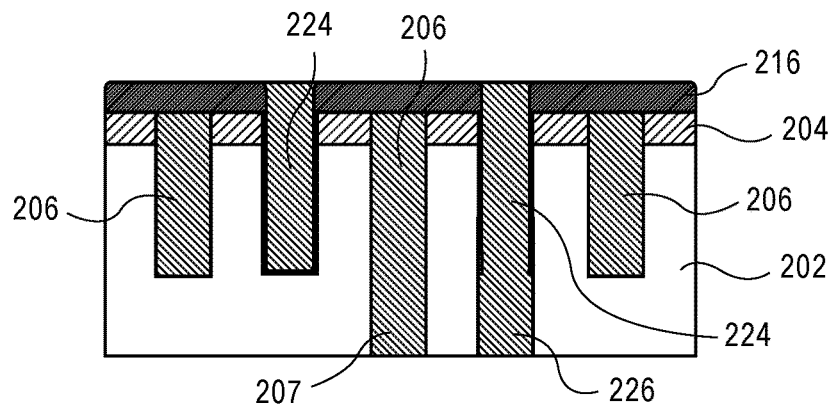

FIG. 2I illustrates the structure of FIG. 2H following second metal line fabrication. In an embodiment, second metal lines 224 (and in some cases, associated conductive vias 226) are formed by performing a metal fill and polish process. The polish process may be a CMP process that further removes the sacrificial cap layer 218.

Figure 2J:
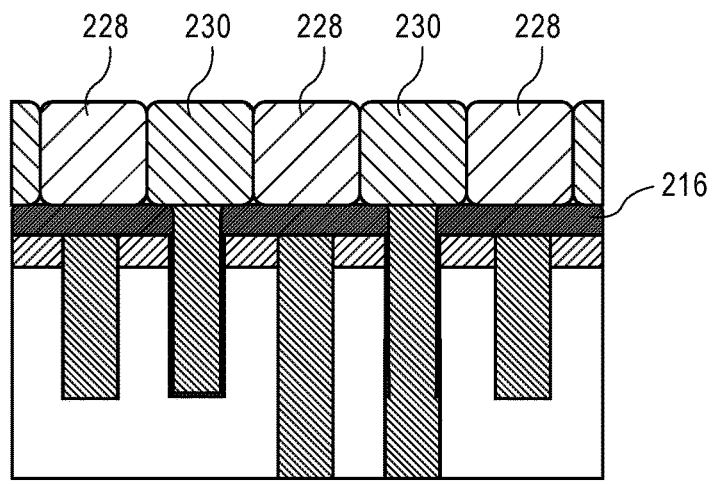

FIG. 2J illustrates the structure of FIG. 2I following directed self-assembly (DSA) or selective growth, e.g., to provide first and second alternating placeholder materials 228 and 230 (or can be permanent materials, as described in association with FIG. 1D).

Figure 2K:
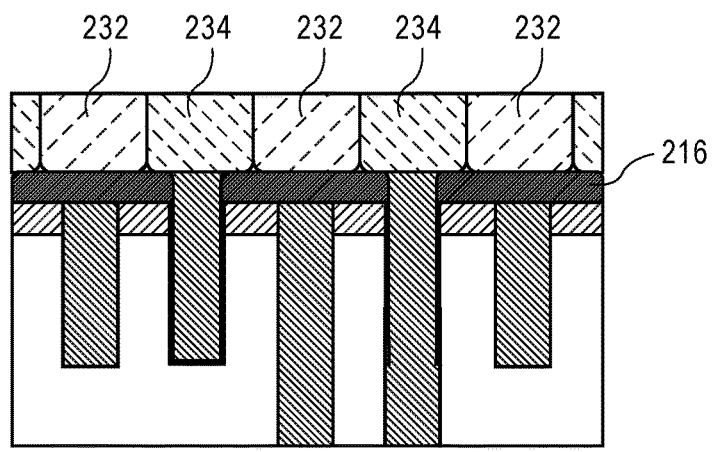

FIG. 2K illustrates the structure of FIG. 2J following replacement of the first and second alternating placeholder materials 228 and 230 with permanent first and second hardmask layers 232 and 234, respectively. The processing for FIGS. 2J and 2K may be as described in association with FIG. 1D.

Figure 2L:
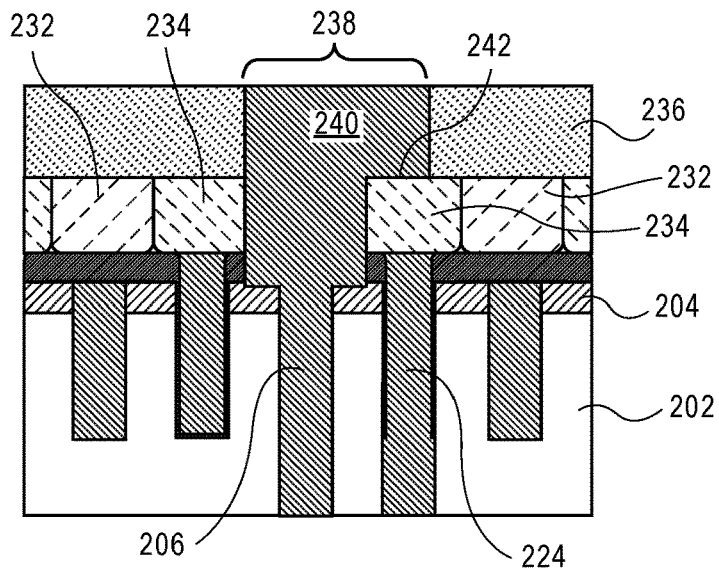

FIG. 2L illustrates the structure of FIG. 2K following next layer via patterning. An upper ILD layer 236 is formed above the first and second hardmask layers 232 and 234. An opening 238 is formed in the upper ILD layer 236. In one embodiment, the opening 238 is formed wider than a via feature size. A select one of the exposed first and second hardmask layers 232 and 234 locations is selected for selective removal, e.g., by a selective etch process. In this case, a first hardmask 232 region is removed selective to exposed portions of the second hardmask layer and 234. A conductive via 240 is then formed in the opening 238 and in the regions where the first hardmask 232 region has been removed. The conductive via 240 contacts one of the first metal lines 206. In an embodiment, the conductive via 240 contacts one of the first metal lines 206 without shorting to one of the adjacent second metal lines 224. In a specific embodiment, a portion 242 of the conductive via 240 is disposed on a second hardmask layer 234 portion without contacting an underlying second metal line 224, as is depicted in FIG. 2L. In an embodiment, then, an improved shorting margin is realized.

In an embodiment, as described in the embodiment above, a first hardmask 232 region is removed for via 240 fabrication. In this case, forming the opening upon removal of the selected first hardmask 232 region further requires etching through an uppermost portion of the non-conformal dielectric cap layer 216. In another embodiment, however, a second hardmask 234 region is removed for via 240 fabrication. In this case, forming the opening upon removal of such a selected second hardmask 234 region directly exposes the metal line 224 to which the via 240 is connected.

In a second more detailed exemplary process flow, involving a via etch first approach, FIGS. 3A-3J illustrate cross-sectional views of portions of integrated circuit layers representing various operations in another method involving dielectric helmet formation for back end of line (BEOL) interconnect fabrication, in accordance with an embodiment of the present invention.

Figure 3A:
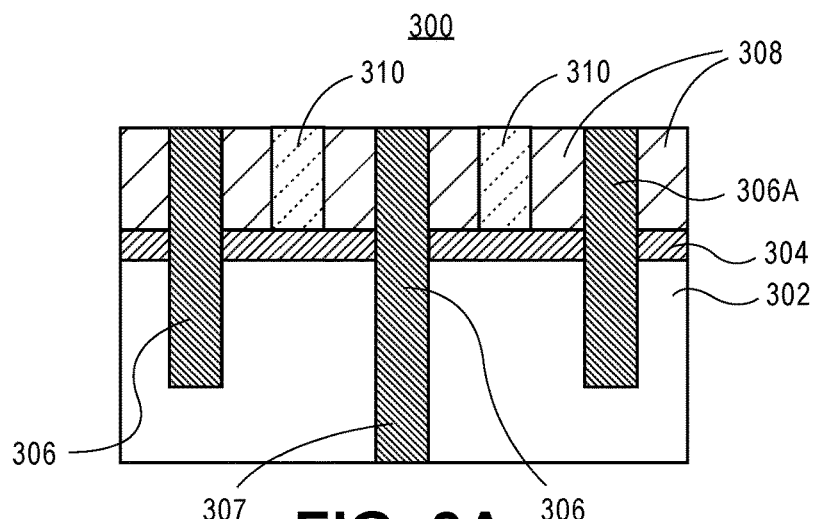
FIGS. 3A-3J illustrate cross-sectional views of portions of integrated circuit layers representing various operations in another method involving dielectric helmet formation for back end of line (BEOL) interconnect fabrication, in accordance with an embodiment of the present invention.

Referring to FIG. 3A, a starting point structure 300 is provided following first metal pass processing as a beginning point for fabricating a new metallization layer. The starting point structure 300 includes a hardmask layer 304 (e.g., silicon nitride) disposed on an inter-layer dielectric (ILD) layer 302. As described below, the ILD layer may be disposed above a substrate and, in one embodiment, is disposed over an underlying metallization layer. First metal lines 306 (and, in some cases, corresponding conductive vias 307) are formed in the ILD layer 302. Protruding portions 306A of the metal lines 306 have adjacent dielectric spacers 308. A sacrificial hardmask layer 310 (e.g., amorphous silicon) is included between neighboring dielectric spacers 308. Although not depicted, in one embodiment, the metal lines 306 are formed by first removal of a second sacrificial hardmask material between dielectric spacers 308 and then etching of the hardmask layer 304 and the ILD layer 302 to form trenches which are then filled in a metallization process.

Figure 3B:
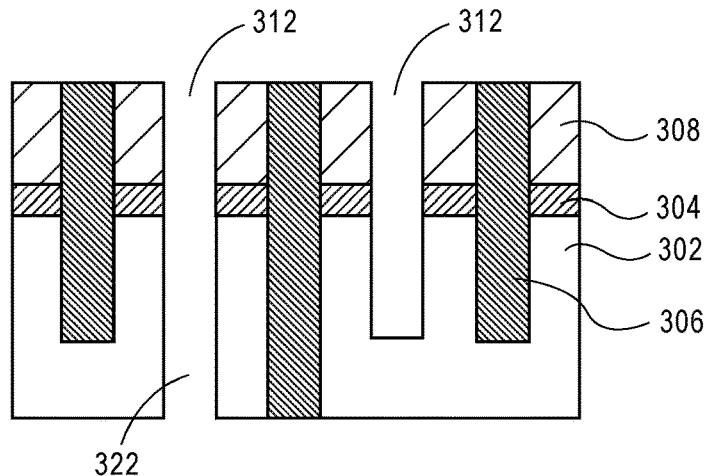

FIG. 3B illustrates the structure of FIG. 3A following second pass metal processing up to an including trench and via location etch. Referring to FIG. 3B, sacrificial hardmask layer 310 is removed to expose hardmask layer 304. Exposed portions of the hardmask layer 304 are removed and trenches 312 are formed in the ILD layer 302. Additionally, in an embodiment, via locations 322 are formed in select locations using a via lithography and etch process, as is depicted in FIG. 3B.

Figure 3C:
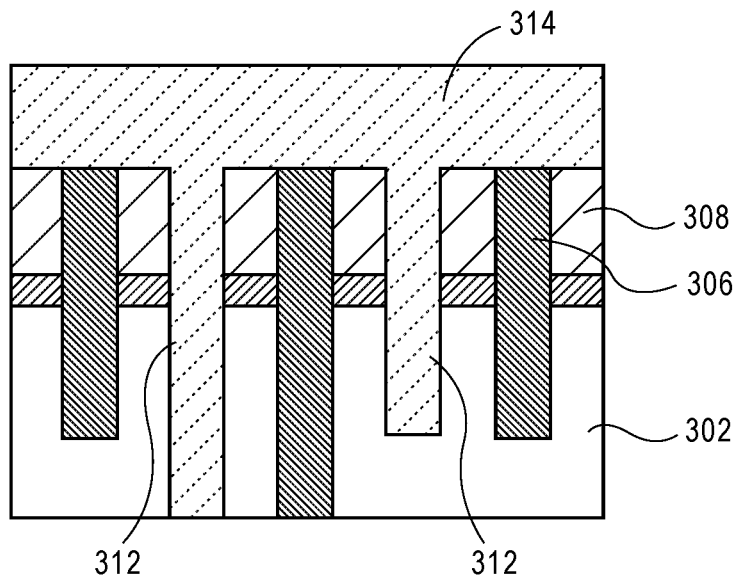

FIG. 3C illustrates the structure of FIG. 3B following sacrificial material fill. A sacrificial material 314 is formed in the trenches 312 and over the spacers 308 and metal lines 306. In an embodiment the sacrificial material 314 is formed in a spin-on process, leaving a substantially flat layer, as is depicted in FIG. 3C.

Figure 3D:
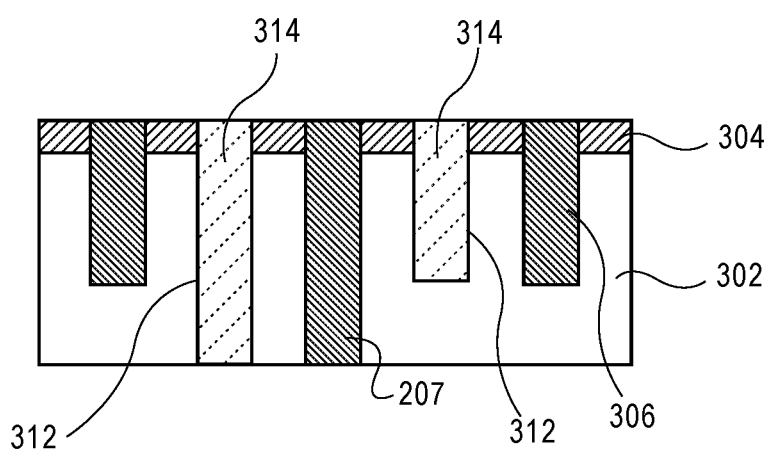

FIG. 3D illustrates the structure of FIG. 3C following a planarization process to re-expose the hardmask layer 304, to remove the dielectric spacers 308, and to remove protruding portions 306A of the metal lines 306. Additionally, the planarization process confined the sacrificial material 314 to the trenches 312 formed in dielectric layer 302. In an embodiment, the planarization process is performed using a chemical mechanical polishing (CMP) process.

Figure 3E:
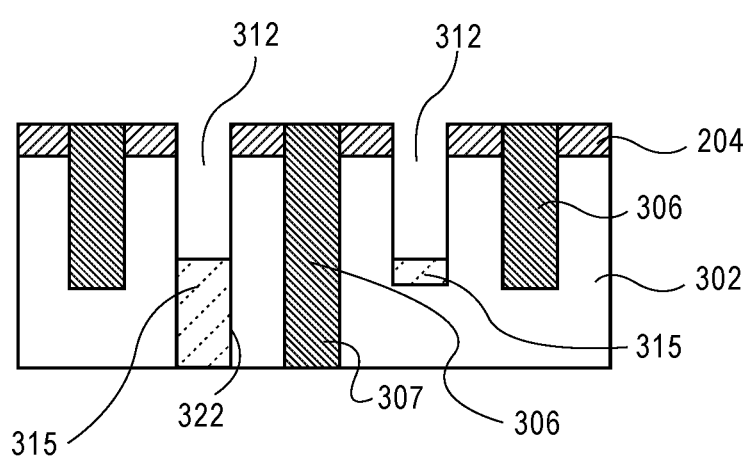

FIG. 3E illustrates the structure of FIG. 3D following partial removal of the sacrificial material 314 to provide recessed sacrificial material 315. In an embodiment, the sacrificial material 214 is recessed within trenches 312 using a wet etch or dry etch process. The recessed sacrificial material 315 may be retained at this point to protect a metal layer underlying via location 322.

Figure 3F:
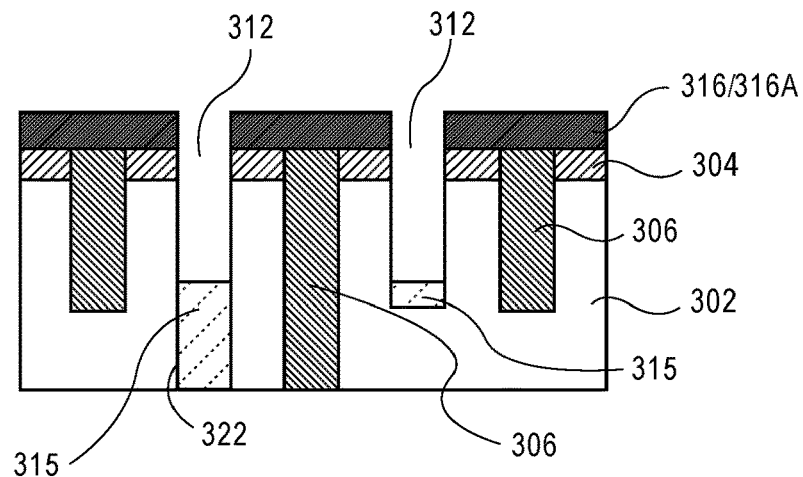

FIG. 3F illustrates the structure of FIG. 3E following deposition of a non-conformal dielectric cap layer 316, which may be referred to as a dielectric helmet. In an embodiment, the non-conformal dielectric cap layer 316 is formed using a physical vapor deposition (PVD), a selective growth process, or a chemical vapor deposition (CVD) process such as a plasma-enhanced CVD (PECVD) process. The non-conformal dielectric cap layer 316 may be as described above in association with the non-conformal dielectric cap layer 110. Alternatively, the non-conformal dielectric cap layer 316 may only include upper portions 316A, with essentially no portion of the non-conformal dielectric cap layer 316 being formed in trenches 312, as is depicted in FIG. 3F.

Figure 3G:
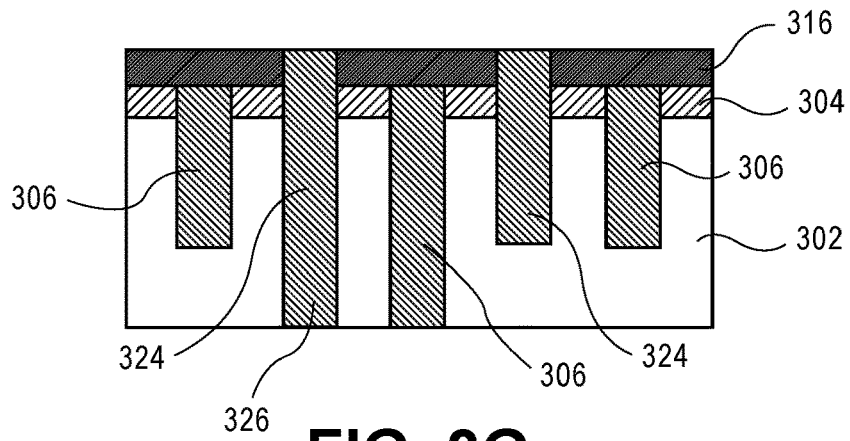

FIG. 3G illustrates the structure of FIG. 3F following second metal line fabrication. In an embodiment, second metal lines 324 (and in some cases, associated conductive vias 326) are formed by performing a metal fill and polish process subsequent to removal of the recessed sacrificial material 315. The polish process may be a CMP process.

Figure 3H:
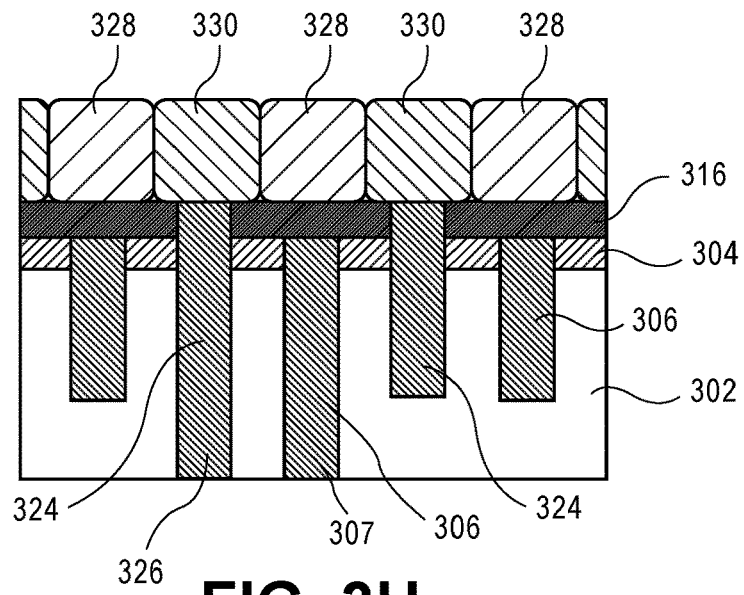

FIG. 3H illustrates the structure of FIG. 3G following directed self-assembly (DSA) or selective growth, e.g., to provide first and second alternating placeholder materials 328 and 330 (or can be permanent materials, as described in association with FIG. 1D).

Figure 3I:
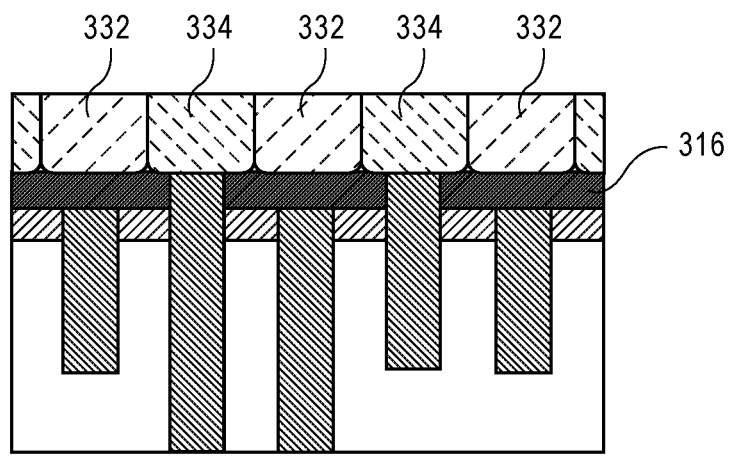

FIG. 3I illustrates the structure of FIG. 3H following replacement of the first and second alternating placeholder materials 328 and 330 with permanent first and second hardmask layers 332 and 334, respectively. The processing for FIGS. 3H and 3I may be as described in association with FIG. 1D.

Figure 3J:
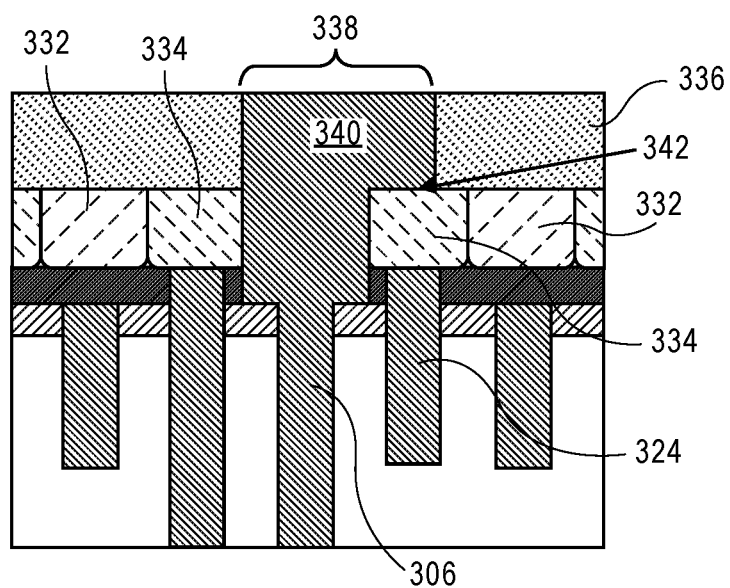

FIG. 3J illustrates the structure of FIG. 3I following next layer via patterning. An upper ILD layer 336 is formed above the first and second hardmask layers 332 and 334. An opening 338 is formed in the upper ILD layer 336. In one embodiment, the opening 338 is formed wider than a via feature size. A select one of the exposed first and second hardmask layers 332 and 334 locations is selected for selective removal, e.g., by a selective etch process. In this case, a first hardmask 332 region is removed selective to exposed portions of the second hardmask layer and 334. A conductive via 340 is then formed in the opening 338 and in the regions where the first hardmask 332 region has been removed. The conductive via 340 contacts one of the first metal lines 306. In an embodiment, the conductive via 340 contacts one of the first metal lines 306 without shorting to one of the adjacent second metal lines 324. In a specific embodiment, a portion 342 of the conductive via 340 is disposed on a second hardmask layer 334 portion without contacting an underlying second metal line 324, as is depicted in FIG. 3J. In an embodiment, then, an improved shorting margin is realized.

In an embodiment, as described in the embodiment above, a first hardmask 332 region is removed for via 340 fabrication. In this case, forming the opening upon removal of the selected first hardmask 332 region further requires etching through an uppermost portion of the non-conformal dielectric cap layer 316. In another embodiment, however, a second hardmask 334 region is removed for via 240 fabrication. In this case, forming the opening upon removal of such a selected second hardmask 334 region directly exposes the metal line 324 to which the via 340 is connected.

Referring again to FIGS. 2L and 3J, by cross-section analysis, a dielectric helmet can be viewed over half the metal populations. Additionally, hardmasks of different materials are self-aligned to the dielectric helmet. Such structures may include one or more of a conductive via with improved shorting margin, alternating hardmask materials, the presence of a dielectric helmet.

A resulting structure such as described in association with FIG. 2L or 3J may subsequently be used as a foundation for forming subsequent metal line/via and ILD layers. Alternatively, the structures of FIG. 2L or 3J may represent the final metal interconnect layer in an integrated circuit. It is to be appreciated that the above process operations may be practiced in alternative sequences, not every operation need be performed and/or additional process operations may be performed. Although the above methods (e.g., FIG. 1A-1D, 2A-2L, or 3A-1J) of fabricating a metallization layer of a BEOL metallization layer have been described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication.

It is to be appreciated that various different approaches may be used to incorporate a dielectric helmet into a BEOL metallization structure. In a first set of exemplary process schemes for integrating a dielectric helmet, FIG. 4 illustrates cross-sectional views of portions of integrated circuit layers representing various operations in another method involving dielectric helmet formation for back end of line (BEOL) interconnect fabrication, in accordance with an embodiment of the present invention.

Figure 4:
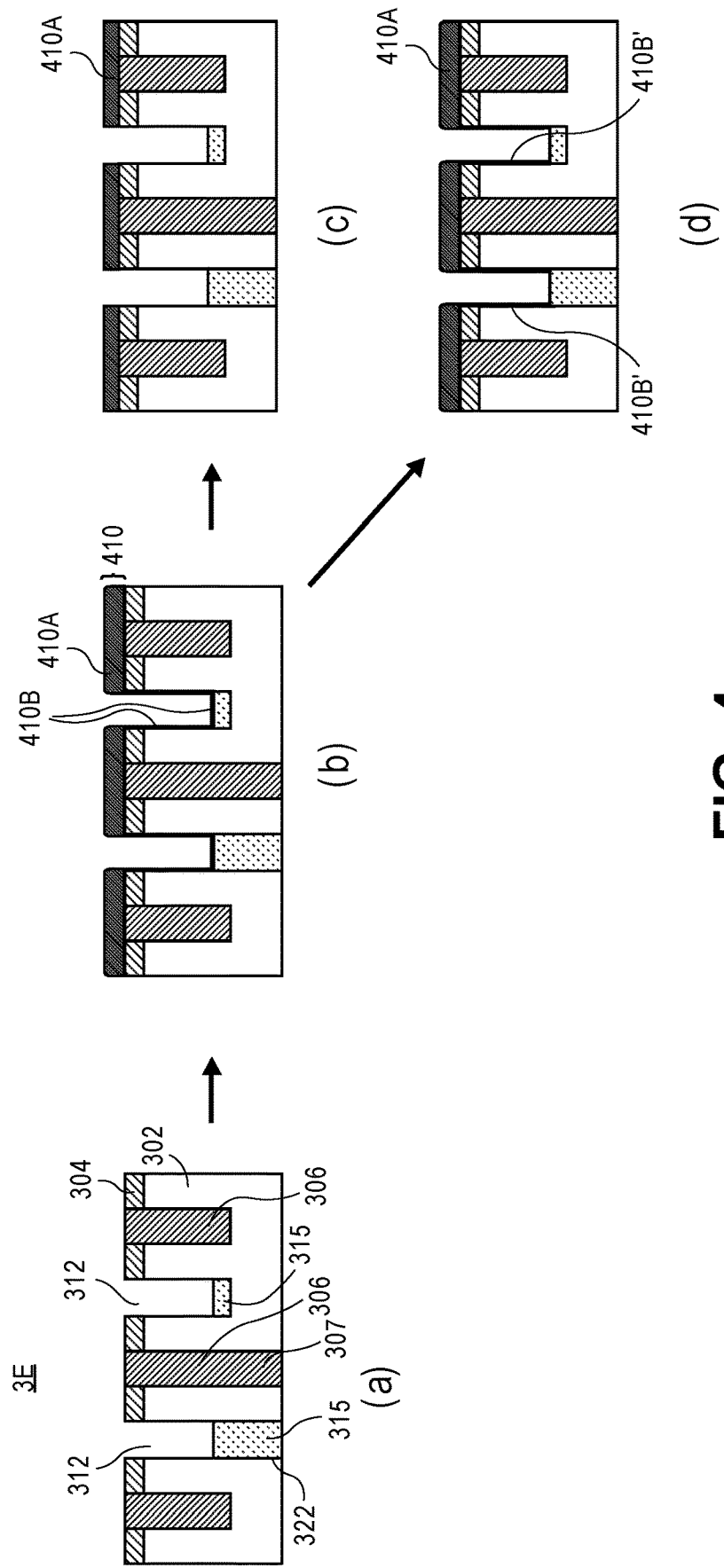
FIG. 4 illustrates cross-sectional views of portions of integrated circuit layers representing various operations in another method involving dielectric helmet formation for back end of line (BEOL) interconnect fabrication, in accordance with an embodiment of the present invention.

Referring to part (a) of FIG. 4, a process begins with the structure illustrated and described in association with FIG. 3E. Referring to part (b) of FIG. 4, a PECVD or PVD deposition process is used to provide a non-conformal dielectric cap layer 410 on the structure of part (a). The non-conformal dielectric cap layer 410 includes upper (helmet) portions 410A and trench portions 410B. Referring to part (c) of FIG. 4, a wet cleans or isotropic dry etch is used to remove the trench portions 410B and to leave the upper portions 410A of the non-conformal dielectric cap layer 410. In an embodiment, since the trench portions 410B are thinner than the upper portions 410A, a wet etch or isotropic dry etch will remove the thinner trench portions 410B without removing the upper portions 410A. Alternatively, referring to part (d) of FIG. 4, a directional dry etch is used to remove only the bottom, exposed, portions of trench portions 410B. The directional dry etch leaves the upper portions 410A and sidewall portions 410B' of the trench portions 410B of the non-conformal dielectric cap layer 410.

Figure 5:
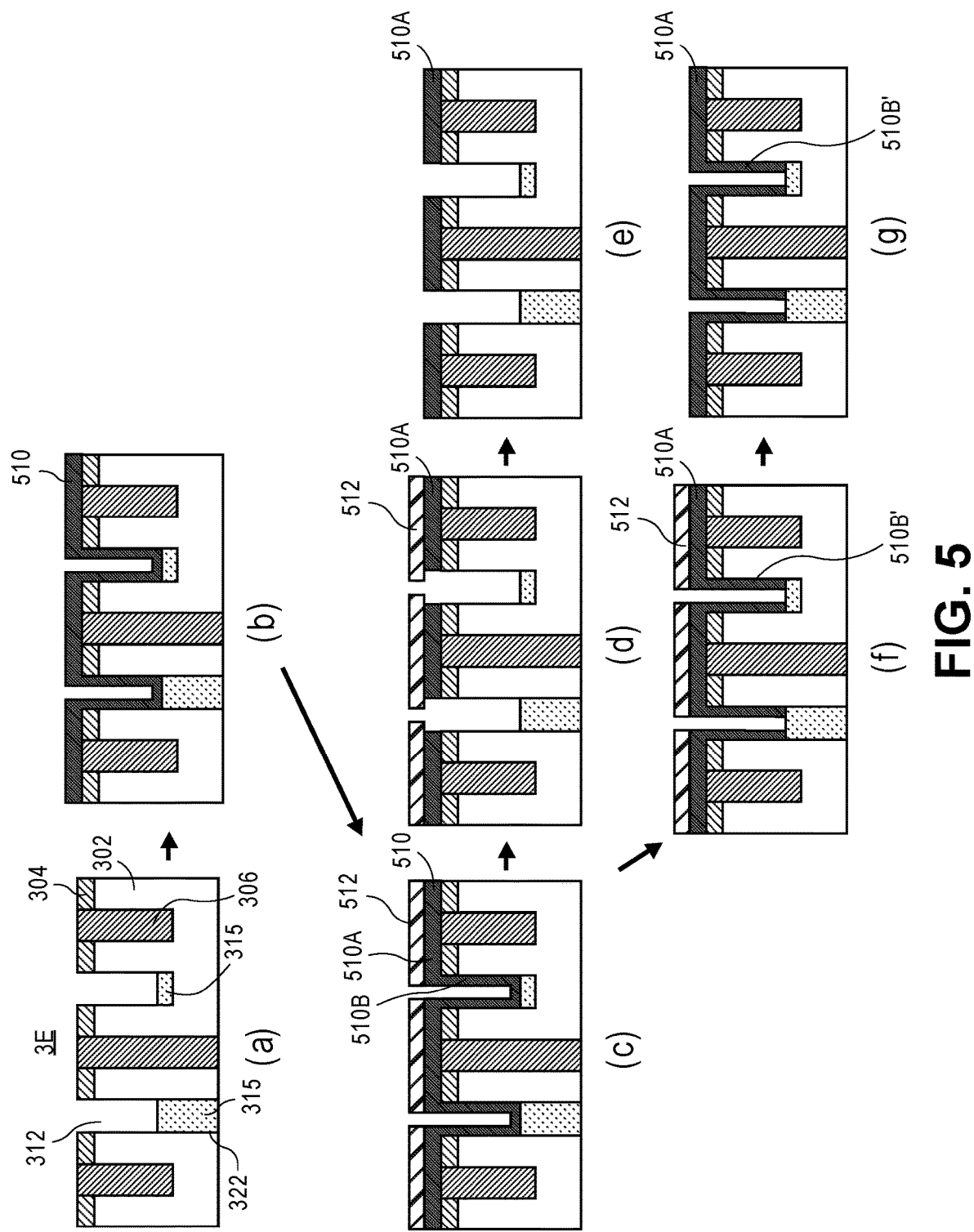
FIG. 5 illustrates cross-sectional views of portions of integrated circuit layers representing various operations in another method involving dielectric helmet formation for back end of line (BEOL) interconnect fabrication, in accordance with an embodiment of the present invention.

In a second set of exemplary process schemes for integrating a dielectric helmet, FIG. 5 illustrates cross-sectional views of portions of integrated circuit layers representing various operations in another method involving dielectric helmet formation for back end of line (BEOL) interconnect fabrication, in accordance with an embodiment of the present invention.

Referring to part (a) of FIG. 5, a process begins with the structure illustrated and described in association with FIG. 3E. Referring to part (b) of FIG. 5, a conformal deposition process is used to provide a conformal dielectric cap layer 510 on the structure of part (a). The conformal dielectric cap layer 510 includes upper portions 510A and trench portions 510B. A non-conformal deposition of a sacrificial hardmask layer (such as a PVD titanium nitride layer) is then used to form a cap 512 on the structure of part (b), as is depicted in part (c) of FIG. 5.

Referring to part (d) of FIG. 5, a wet cleans or isotropic dry etch is used to remove the trench portions 510B and to leave the upper portions 510A of the conformal dielectric cap layer 510. In an embodiment, since the trench portions 510B are exposed while the upper portions 510A are protected by cap 512, a wet etch or isotropic dry etch will remove the trench portions 510B without removing the upper portions 510A. The cap layer 512 may subsequently be removed, as is depicted in part (e) of FIG. 5.

Alternatively, referring to part (f) of FIG. 5, a directional dry etch is used to remove only the bottom, exposed, portions of trench portions 510B. The directional dry etch leaves the upper portions 510A and sidewall portions 510B' of the trench portions 510B of the conformal dielectric cap layer 510. The cap layer 512 may subsequently be removed, as is depicted in part (g) of FIG. 5.

In an embodiment, as used throughout the present description, an interlayer dielectric (ILD) material is composed of or includes a layer of a dielectric or insulating material. Examples of suitable dielectric materials include, but are not limited to, oxides of silicon (e.g., silicon dioxide ($SiO_2$)), nitrides of silicon (e.g., silicon nitride ($Si_3N_4$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a barrier layer and a conductive fill material. In one embodiment, the barrier layer is a tantalum or tantalum nitride layer, or a combination thereof. In one embodiment, the conductive fill material is a material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, metal lines, or simply interconnect.

In an embodiment, as is also used throughout the present description, hardmask materials (and in some instances etch stop layers) are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials, such as silicon carbide. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the art may be used depending upon the particular implementation. The hardmask layers may be formed by CVD, PVD, or by other deposition methods.

It is to be appreciated that the layers and materials described in association with FIGS. 1A-1D, 2A-2L, 3A-3J, 4 and 5 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 1D, 2L or 3J (i.e., as starting from FIG. 1A, 2A or 3A, respectively) may be fabricated on underlying lower level interconnect layers.

As described above, patterned features may be patterned in a grating-like pattern with lines, holes or trenches spaced at a constant pitch and having a constant width. The pattern, for example, may be fabricated by a pitch halving or pitch quartering approach. In an example, a blanket film (such as a polycrystalline silicon film) is patterned using lithography and etch processing which may involve, spacer-based-quadruple-patterning (SBQP) or pitch quartering. It is to be appreciated that a grating pattern of lines can be fabricated by numerous methods, including 193 nm immersion litho (i193), EUV and/or EBDW lithography, directed self-assembly, etc. In other embodiments, the pitch does not need to be constant, nor does the width.

Figure 6A:
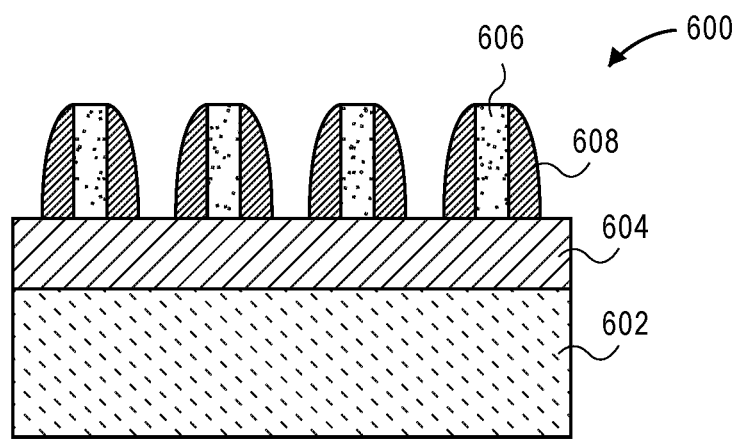
FIG. 6A illustrates a cross-sectional view of a starting structure following deposition, but prior to patterning, of a hardmask material layer formed on an interlayer dielectric (ILD) layer, in accordance with an embodiment of the present invention.
Figure 6B:
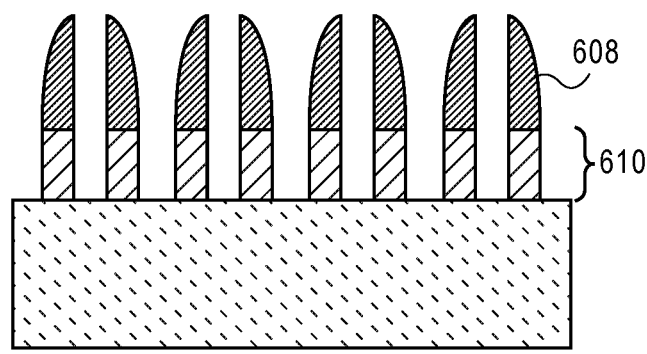
FIG. 6B illustrates a cross-sectional view of the structure of FIG. 6A following patterning of the hardmask layer by pitch halving, in accordance with an embodiment of the present invention.

In an embodiment, pitch division techniques are used to increase a line density. In a first example, pitch halving can be implemented to double the line density of a fabricated grating structure. FIG. 6A illustrates a cross-sectional view of a starting structure following deposition, but prior to patterning, of a hardmask material layer formed on an interlayer dielectric (ILD) layer. FIG. 6B illustrates a cross-sectional view of the structure of FIG. 6A following patterning of the hardmask layer by pitch halving.

Referring to FIG. 6A, a starting structure 600 has a hardmask material layer 604 formed on an interlayer dielectric (ILD) layer 602. A patterned mask 606 is disposed above the hardmask material layer 604. The patterned mask 606 has spacers 608 formed along sidewalls of features (lines) thereof, on the hardmask material layer 604.

Referring to FIG. 6B, the hardmask material layer 604 is patterned in a pitch halving approach. Specifically, the patterned mask 606 is first removed. The resulting pattern of the spacers 608 has double the density, or half the pitch or the features of the mask 606. The pattern of the spacers 608 is transferred, e.g., by an etch process, to the hardmask material layer 604 to form a patterned hardmask 610, as is depicted in FIG. 6B. In one such embodiment, the patterned hardmask 610 is formed with a grating pattern having unidirectional lines. The grating pattern of the patterned hardmask 610 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 610 of FIG. 6B may have hardmask lines spaced at a constant pitch and having a constant width relative to one another. The dimensions achieved may be far smaller than the critical dimension of the lithographic technique employed. Accordingly, a blanket film may be patterned using lithography and etch processing which may involve, e.g., spacer-based-double-patterning (SBDP) or pitch halving, or spacer-based-quadruple-patterning (SBQP) or pitch quartering.

Figure 7:
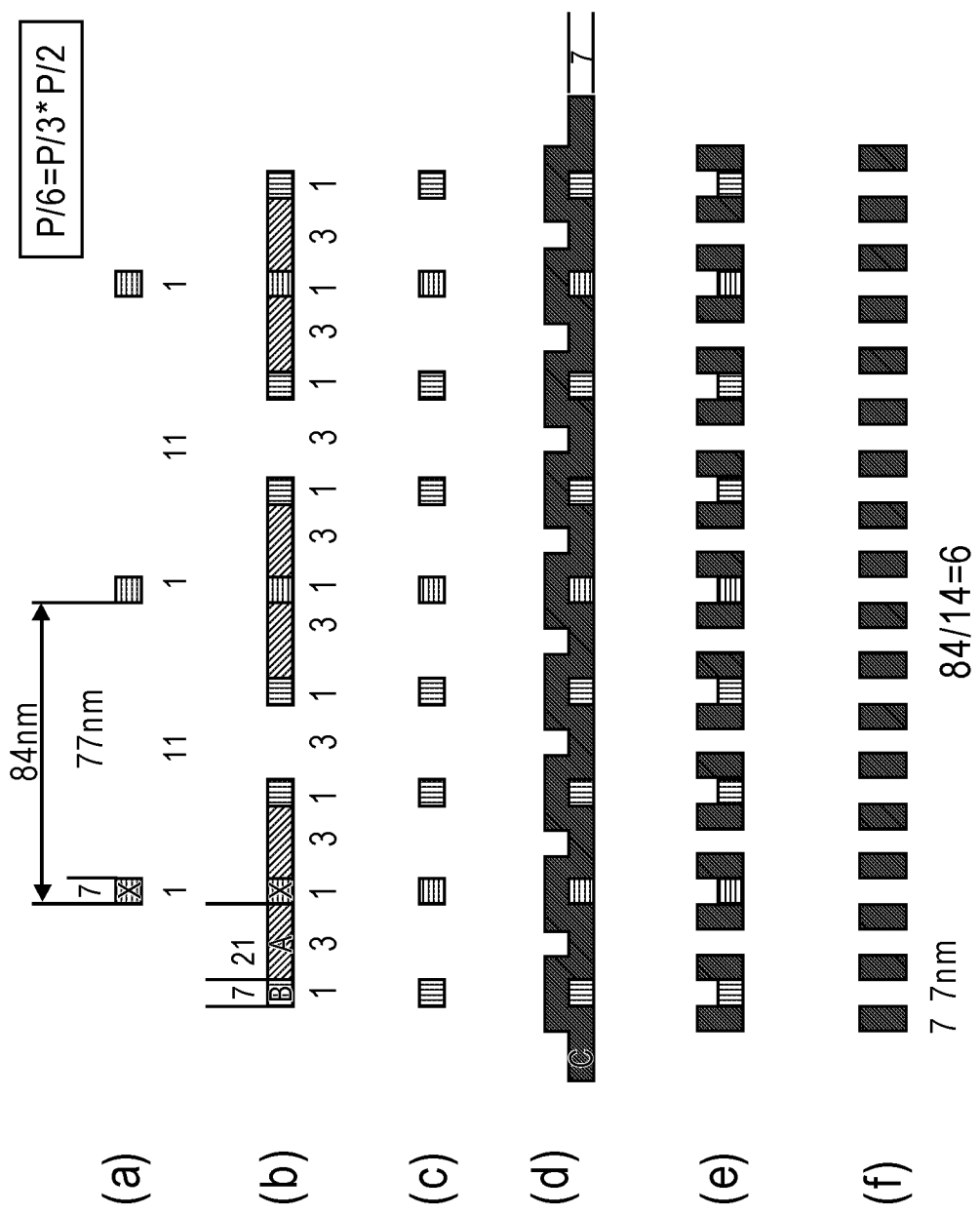
FIG. 7 illustrates cross-sectional views in a spacer-based-sextuple-patterning (SBSP) processing scheme which involves pitch division by a factor of six, in accordance with an embodiment of the present invention.

It is to be appreciated that other pitch division approaches may also be implemented. For example, FIG. 7 illustrates cross-sectional views in a spacer-based-sextuple-patterning (SBSP) processing scheme which involves pitch division by a factor of six. Referring to FIG. 7, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C deposition. At operation (e), the pattern of operation (d) is shown following spacer C etch. At operation (f), a pitch/6 pattern is achieved following sacrificial pattern X removal and spacer B removal.

In an embodiment, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
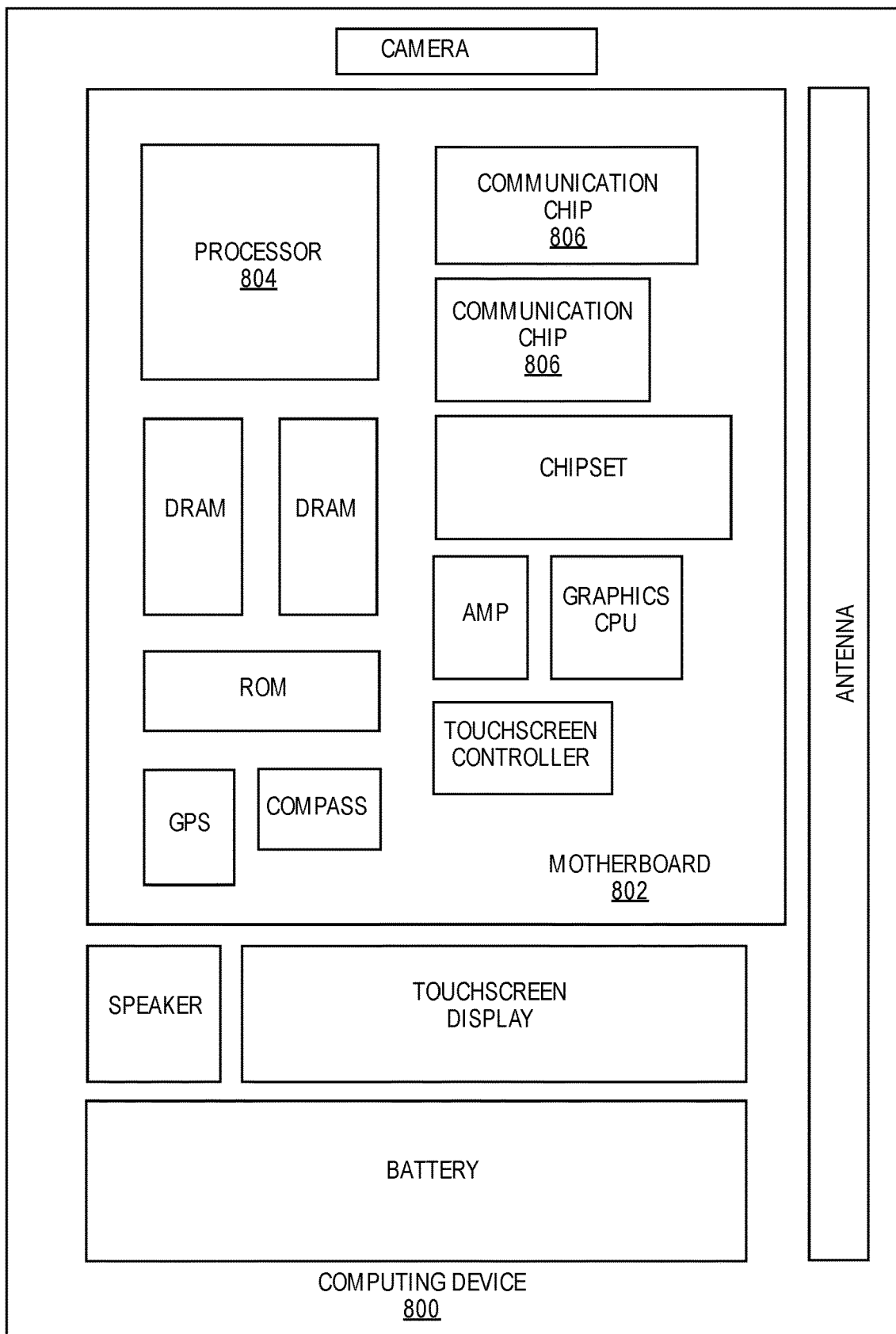
FIG. 8 illustrates a computing device in accordance with one implementation of an embodiment of the present invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more structures, such as BEOL metallization layers, built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more structures, such as BEOL metallization layers, built in accordance with implementations of the invention.

In further implementations, another component housed within the computing device 800 may contain an integrated circuit die that includes one or more structures, such as BEOL metallization layers, built in accordance with implementations of the invention.

In various implementations, the computing device 800 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
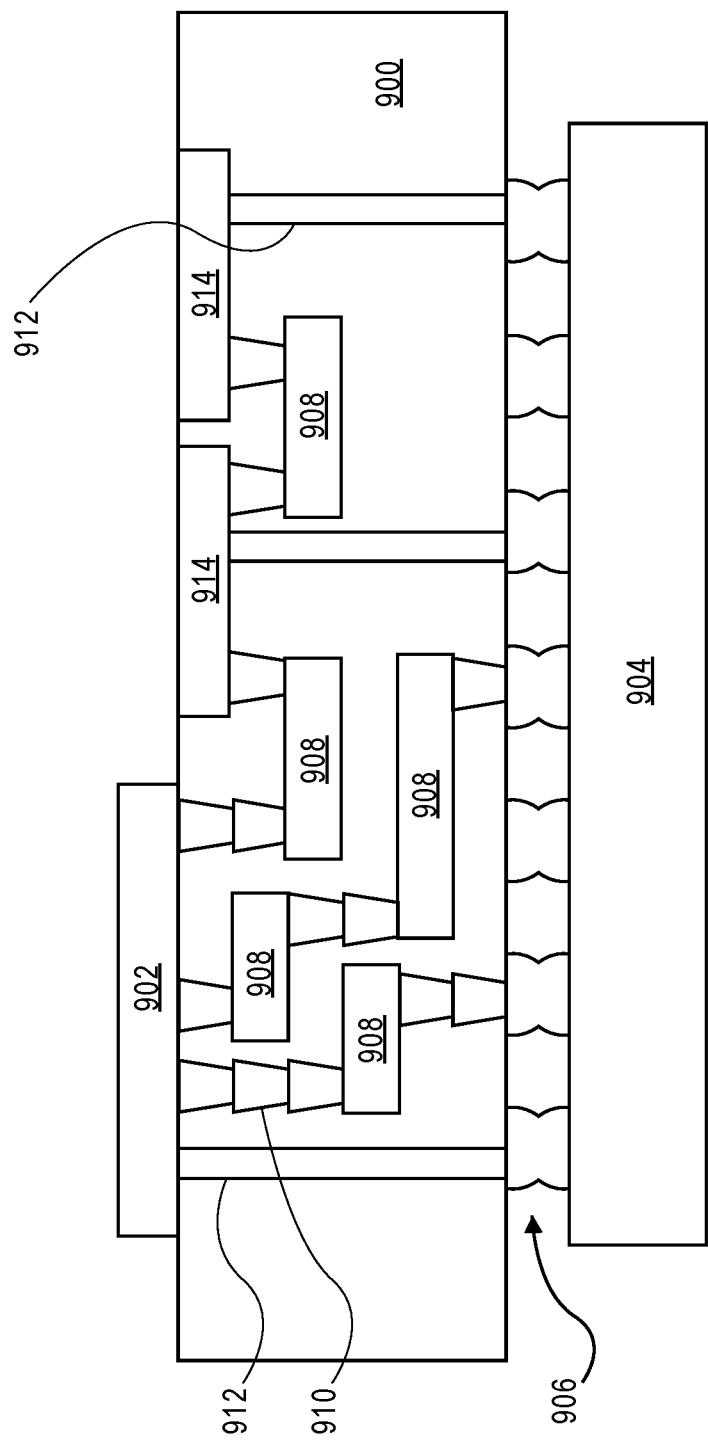
FIG. 9 is an interposer implementing one or more embodiments of the invention.

FIG. 9 illustrates an interposer 900 that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the invention, apparatuses or processes disclosed herein may be used in the fabrication of interposer 900.

Thus, embodiments of the present invention include dielectric helmet-based approaches for back end of line (BEOL) interconnect fabrication, and the resulting structures.

In an embodiment, a semiconductor structure includes a substrate. A plurality of alternating first and second conductive line types is disposed along a same direction of a back end of line (BEOL) metallization layer disposed in an inter-layer dielectric (ILD) layer disposed above the substrate. A dielectric layer is disposed on an uppermost surface of the first conductive line types but not along sidewalls of the first conductive line types, and is disposed along sidewalls of the second conductive line types but not on an uppermost surface of the second conductive line types.

In one embodiment, the semiconductor structure further includes a first hardmask layer disposed over the first conductive line types but not over the second conductive line types, and a second hardmask layer disposed over the second conductive line types but not over the first conductive line types, where the first and second hardmask layers differ in composition.

In one embodiment, the semiconductor structure further includes a conductive via structure disposed in an opening in the first hardmask layer and connected to one of the first conductive line types, where a portion of the conductive via structure is disposed on a portion of the second hardmask layer.

In one embodiment, the conductive via structure is further disposed in an opening of the dielectric layer.

In one embodiment, the semiconductor structure further includes a conductive via structure disposed in an opening in the second hardmask layer and connected to one of the second conductive line types, where a portion of the conductive via structure is disposed on a portion of the first hardmask layer.

In one embodiment, the uppermost surface of the first conductive line types is not substantially co-planar with the uppermost surface of the second conductive line types.

In one embodiment, an uppermost surface of the dielectric layer is substantially co-planar with the uppermost surface of the second conductive line types.

In one embodiment, the dielectric layer is further disposed along a bottom surface of one of the second conductive line types.

In one embodiment, one of the second conductive line types is coupled to an underlying conductive via structure, through an opening in the dielectric layer, the underlying conductive via structure connected to an underlying metallization layer of the semiconductor structure.

In one embodiment, the lines of the first conductive line type are spaced apart by a pitch, and the lines of the second conductive line type are spaced apart by the pitch.

In one embodiment, the lines of the plurality of alternating first and second conductive line types each include a barrier layer disposed along a bottom of and sidewalk of the line and a conductive fill material on the barrier layer.

In one embodiment, a total composition of the first conductive line type is the same as a total composition of the second conductive line type.

In one embodiment, a total composition of the first conductive line type is different from a total composition of the second conductive line type.

In an embodiment, a semiconductor structure includes a substrate. A plurality of alternating first and second conductive line types is disposed along a same direction of a back end of line (BEOL) metallization layer disposed in an inter-layer dielectric (ILD) layer disposed above the substrate. A first hardmask layer is disposed over the first conductive line types but not over the second conductive line types. A second hardmask layer is disposed over the second conductive line types but not over the first conductive line types. The first and second hardmask layers differ in composition.

In one embodiment, the semiconductor structure further includes a conductive via structure disposed in an opening in the first hardmask layer and connected to one of the first conductive line types, where a portion of the conductive via structure is disposed on a portion of the second hardmask layer.

In one embodiment, an uppermost surface of the first conductive line types is not substantially co-planar with an uppermost surface of the second conductive line types.

In one embodiment, one of first conductive line types is coupled to an underlying conductive via structure, the underlying conductive via structure connected to an underlying metallization layer of the semiconductor structure.

In one embodiment, the lines of the first conductive line type are spaced apart by a pitch, and the lines of the second conductive line type are spaced apart by the pitch.

In one embodiment, the lines of the plurality of alternating first and second conductive line types each include a barrier layer disposed along a bottom of and sidewalls of the line and a conductive fill material on the barrier layer.

In one embodiment, a total composition of the first conductive line type is the same as a total composition of the second conductive line type.

In one embodiment, a total composition of the first conductive line type is different from a total composition of the second conductive line type.

In an embodiment, a method of fabricating a back end of line (BEOL) metallization layer includes forming a first plurality of line trenches in an inter-layer dielectric (ILD) layer formed above a substrate. The method also includes forming first conductive lines in the first plurality of line trenches. The method also includes, subsequent to forming a first conductive lines, forming a second plurality of line trenches in the ILD layer. The second plurality of line trenches is alternating with the first conductive lines. The method also includes forming a dielectric layer over the first conductive lines and along sidewalls and bottoms of the second plurality of line trenches. Portions of the dielectric layer over the first conductive lines have a thickness greater than portions of the dielectric layer along the sidewalls and the bottoms of the second plurality of line trenches. The method also includes forming second conductive lines in the second plurality of line trenches.

In one embodiment, the method further includes using a directed self-assembly (DSA) approach to form a first hardmask layer over the first conductive lines but not over the second conductive lines, and a second hardmask layer over the second conductive lines but not over the first conductive lines, where the first and second hardmask layers differ in etch selectivity.

In one embodiment, the method further includes using a selective growth approach to form a first hardmask layer over the first conductive lines but not over the second conductive lines, and a second hardmask layer over the second conductive lines but not over the first conductive lines, where the first and second hardmask layers differ in etch selectivity.

In one embodiment, forming the first plurality of line inches in an ILD layer includes using a pitch division patterning process.

What is claimed is:

1. A semiconductor structure, comprising:
   a substrate;
   a plurality of alternating first and second conductive line types disposed along a same direction of a back end of line (BEOL) metallization layer disposed in an inter-layer dielectric (ILD) layer disposed above the substrate; and
   a dielectric layer disposed directly on and completely covering an uppermost surface of the first conductive line types but not along sidewalls of the first conductive line types, and disposed along sidewalls of the second conductive line types but not on an uppermost surface of the second conductive line types, the dielectric layer in direct contact with the sidewalls of the second conductive line types.

2. The semiconductor structure of claim 1, further comprising:
   a first hardmask layer disposed over the first conductive line types but not over the second conductive line types; and
   a second hardmask layer disposed over the second conductive line types but not over the first conductive line types, wherein the first and second hardmask layers differ in composition.

3. The semiconductor structure of claim 2, further comprising:
   a conductive via structure disposed in an opening in the first hardmask layer and connected to one of the first conductive line types, wherein a portion of the conductive via structure is disposed on a portion of the second hardmask layer.

4. The semiconductor structure of claim 3, wherein the conductive via structure is further disposed in an opening of the dielectric layer.

5. The semiconductor structure of claim 2, further comprising:
   a conductive via structure disposed in an opening in the second hardmask layer and connected to one of the second conductive line types, wherein a portion of the conductive via structure is disposed on a portion of the first hardmask layer.

6. The semiconductor structure of claim 1, wherein the uppermost surface of the first conductive line types is not substantially co-planar with the uppermost surface of the second conductive line types.

7. The semiconductor structure of claim 1, wherein an uppermost surface of the dielectric layer is substantially co-planar with the uppermost surface of the second conductive line types.

8. The semiconductor structure of claim 1, wherein the dielectric layer is further disposed along a bottom surface of one of the second conductive line types.

9. The semiconductor structure of claim 1, wherein one of the second conductive line types is coupled to an underlying conductive via structure, through an opening in the dielectric layer, the underlying conductive via structure connected to an underlying metallization layer of the semiconductor structure.

10. The semiconductor structure of claim 1, wherein the lines of the first conductive line type are spaced apart by a pitch, and wherein the lines of the second conductive line type are spaced apart by the pitch.

11. The semiconductor structure of claim 1, wherein the lines of the plurality of alternating first and second conductive line types each comprise a barrier layer disposed along a bottom of and sidewalls of the line and a conductive fill material on the barrier layer.

12. The semiconductor structure of claim 1, wherein a total composition of the first conductive line type is the same as a total composition of the second conductive line type.

13. The semiconductor structure of claim 1, wherein a total composition of the first conductive line type is different from a total composition of the second conductive line type.

14. A computing device, comprising:
    a board; and
    a component coupled to the board, the component including an integrated circuit structure, comprising:
    a substrate;

a plurality of alternating first and second conductive line types disposed along a same direction of a back end of line (BEOL) metallization layer disposed in an inter-layer dielectric (ILD) layer disposed above the substrate; and a dielectric layer disposed directly on and completely covering an uppermost surface of the first conductive line types but not along sidewalls of the first conductive line types, and disposed along sidewalls of the second conductive line types but not on an uppermost surface of the second conductive line types, the dielectric layer in direct contact with the sidewalls of the second conductive line types.

15. The computing device of claim 14, further comprising:

a memory coupled to the board.

16. The computing device of claim 14, further comprising:

a communication chip coupled to the board.

17. The computing device of claim 14, further comprising:

a camera coupled to the board.

18. The computing device of claim 14, further comprising:

a battery coupled to the board.

19. The computing device of claim 14, further comprising:

a global positioning system (GPS) coupled to the board.

20. The computing device of claim 14, wherein the component is a packaged integrated circuit die.

* * * * *